(12) United States Patent
Khazen et al.

(10) Patent No.: US 10,109,968 B2
(45) Date of Patent: Oct. 23, 2018

(54) ADAPTIVE DATACENTER CONNECTOR

(71) Applicant: Mellanox Technologies, Ltd., Yokneam (IL)

(72) Inventors: Nimer Khazen, Yokneam (IL); Andrey Ger, Yokneam (IL); Hen Sery, Yokneam (IL)

(73) Assignee: Mellanox Technologies, Ltd, Yokneam (IL)

(*) Notice: Subject to any disclaimer, the term of this patent is extended or adjusted under 35 U.S.C. 154(b) by 0 days.

(21) Appl. No.: 15/395,210

(22) Filed: Dec. 30, 2016

(65) Prior Publication Data

US 2018/0191115 A1 Jul. 5, 2018

(51) Int. Cl.
*H01R 31/06* (2006.01)
*G02B 6/42* (2006.01)
*H05K 7/20* (2006.01)
*H01B 1/02* (2006.01)
*G02B 6/38* (2006.01)

(52) U.S. Cl.
CPC ............ *H01R 31/06* (2013.01); *G02B 6/3817* (2013.01); *G02B 6/3873* (2013.01); *G02B 6/4261* (2013.01); *G02B 6/4268* (2013.01); *G02B 6/4269* (2013.01); *G02B 6/4292* (2013.01); *H01B 1/023* (2013.01); *H01B 1/026* (2013.01); *H05K 7/20409* (2013.01); *H05K 7/20436* (2013.01)

(58) Field of Classification Search
CPC .................................................... G02B 6/4249
See application file for complete search history.

(56) References Cited

U.S. PATENT DOCUMENTS

| | | | |
|---|---|---|---|
| 6,866,544 B1 | 3/2005 | Casey et al. | |
| 7,457,126 B2 | 11/2008 | Ahrens | |
| 8,670,236 B2 | 3/2014 | Szczesny et al. | |
| 9,893,474 B1 | 2/2018 | Jandt et al. | |
| 9,924,615 B2* | 3/2018 | Bucher | H05K 7/20418 |
| 2003/0159772 A1 | 8/2003 | Wolf et al. | |
| 2004/0027816 A1* | 2/2004 | Ice | G02B 6/4201 361/797 |
| 2005/0195565 A1 | 9/2005 | Bright | |
| 2015/0029667 A1 | 1/2015 | Szczesny | |
| 2015/0342090 A1 | 11/2015 | Yang et al. | |
| 2016/0093996 A1 | 3/2016 | Phillips | |
| 2016/0238805 A1* | 8/2016 | McColloch | G02B 6/4268 |

* cited by examiner

*Primary Examiner* — Michelle R Connelly
(74) *Attorney, Agent, or Firm* — Alston & Bird LLP (57) ABSTRACT

Apparatuses and associated methods of manufacturing are described that provide an adaptive connector configured to connect between a cable connector and a switch module in a datacenter. The adaptive connector includes a body defining a top, bottom, and two side portions extending between the top and bottom portion. The body of the adaptive connector defines a first end for receiving the cable connector and a second end that is received by a switch module for enabling signals to pass between the cable connector and switch module. The adaptive connector further defines a heat dissipation elements for transferring heat between the adaptive connector and an external environment of the adaptive connector.

18 Claims, 9 Drawing Sheets

ADAPTIVE DATACENTER CONNECTOR

BACKGROUND

The present disclosure relates in general to connectors used with datacenter switch systems. In particular, adaptive connectors utilizing heat dissipation elements are described that are configured to increase the thermal performance of data center connections.

Datacenter switch systems and associated modules may generally include connections between other switch systems, servers, and devices. Such connections may be made using cables, transceivers, and connectors, which may include a backshell or housing. Often, these connectors have low thermal performance, which can result in failures of system components.

BRIEF SUMMARY

Accordingly, the apparatuses and methods described herein provide improved mechanisms for dissipating heat associated with data center connectors. In some embodiments, an adaptive connector configured to connect between a cable connector and a switch module in a datacenter is provided and comprises a body defined by a top portion, a bottom portion, and two side portions extending therebetween, wherein the body may define a receiving space configured to at least partially receive a cable connector therein. The body of the adaptive connector may define a first end configured to receive the cable connector and a second end configured to be received by a switch module for enabling signals to pass between the cable connector and the switch module. The body may further comprise a heat dissipation element extending from an inner surface of the top portion towards the receiving space, wherein the heat dissipation element may be configured to allow heat to be transferred from the body to an external environment of the adaptive connector.

In some embodiments, the top portion, the bottom portion, and the two side portions may be integral to the body. In other embodiments, the heat dissipation element may be integral to the top portion of the body.

In some cases, the heat dissipation element may be disposed longitudinally along the length of the connector between the first end and the second end and/or may comprise a plurality of fins.

In some further embodiments, the adaptive connector may be comprised of a copper alloy, while in other further embodiments, the adaptive connector may be comprised of an aluminum alloy.

In some still further cases, the cable may further comprise an active optical cable and active optical module for transmitting optical signals.

In some alternate cases, the cable may further comprise a direct attach copper cable.

In some still alternate cases, the cable may further comprise an Ethernet cable.

In some embodiments, a method of manufacturing an adaptive connector configured to connect between a cable connector and a switch module in a data center is provided and comprises the steps of extruding a body to define a top portion, a bottom portion, and two side portions extending therebetween, wherein the body defines a receiving space configured to at least partially receive a cable connector therein. The method may further comprise machining the body to define a first end configured to receive the cable connector, and a second end configured to be received by a switch module for enabling signals to pass between the cable connector and the switch module. The step of machining the body may further comprise defining a heat dissipation element extending from an inner surface of the top portion towards the receiving space, wherein the heat dissipation element may be configured to allow heat to be transferred from the body to an external environment of the adaptive connector.

In some embodiments, the top portion, the bottom portion, and the two side portions may be integral to the body. In other embodiments, the heat dissipation element may be integral to the top portion of the body.

In some cases, the heat dissipation element may be disposed longitudinally along the length of the connector between the first end and the second end and/or may comprise a plurality of fins.

In some further embodiments, the adaptive connector may be comprised of a copper alloy, while in other further embodiments, the adaptive connector may be comprised of an aluminum alloy.

In some still further cases, the cable may further comprise an active optical cable and active optical module for transmitting optical signals.

In some alternate cases, the cable may further comprise a direct attach copper cable.

In some still alternate cases, the cable may further comprise an Ethernet cable.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

DETAILED DESCRIPTION OF THE DRAWINGS

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc.

are used for explanatory purposes in the examples provided below to describe the relative position of certain components or portions of components. As used herein, the term "module" encompasses hardware, software and/or firmware configured to perform one or more particular functions, including but not limited to conversion between electrical and optical signal and transmission of the same. As discussed herein, the example embodiment may be described with reference to an active optical cable (AOC) as a transmission medium. However, the present disclosure may be equally applicable for use with any cable (e.g., passive copper cable (PCC), active copper cable (ACC), or the like) or interconnect utilized by datacenter racks and associated switch modules (e.g., an active optical module (AOM), quad small form-factor pluggable (QSFP), or the like). Additionally, as discussed herein, the example embodiment may be described with reference to a vertical-cavity surface-emitting laser (VCSEL) as an element of a transceiver system. However, the present disclosure may be equally applicable for use with any transceiver system and/or element.

Extensive growth in global internet traffic due to increasing demands for high-definition video and high-speed broadband penetration has required new hardware that allows for higher data transmission rates in datacenters. This growth has resulted in the use of optical fibers offering enhanced capacity (e.g., greater bandwidth) over distance, increased bandwidth density, greater security and flexibility, and lower costs as compared to conventionally-used copper cables. A conventional datacenter rack 100, or cabinet that is designed to house servers, networking devices, modules, and other datacenter computing equipment and used in conjunction with optical fibers, is depicted in FIG. 1.

Accordingly, various different types of connectors also exist for enabling transmission of signals (optical and/or electrical) between switch modules and other equipment in a datacenter. For example, Quad Small Form-factor Pluggable (QSFP) connectors and cables, as well as other forms of connectors such as Small Form Pluggable (SFP) and C-Form-factor Pluggable (CFP) connectors, have long been the industry standard for providing high-speed information operations interface interconnects. More recently, Octal Small Form-factor Pluggable (OSFP) transceivers have come about to provide increased bit rate capabilities of up to 400 Gbps. Regardless of the type of connector, these transceivers interface a switch system board, such as a motherboard in a switch system, to a fiber optic or copper networking cable, such as by making connections between switch modules 102 as shown in FIG. 1.

Figure 1:
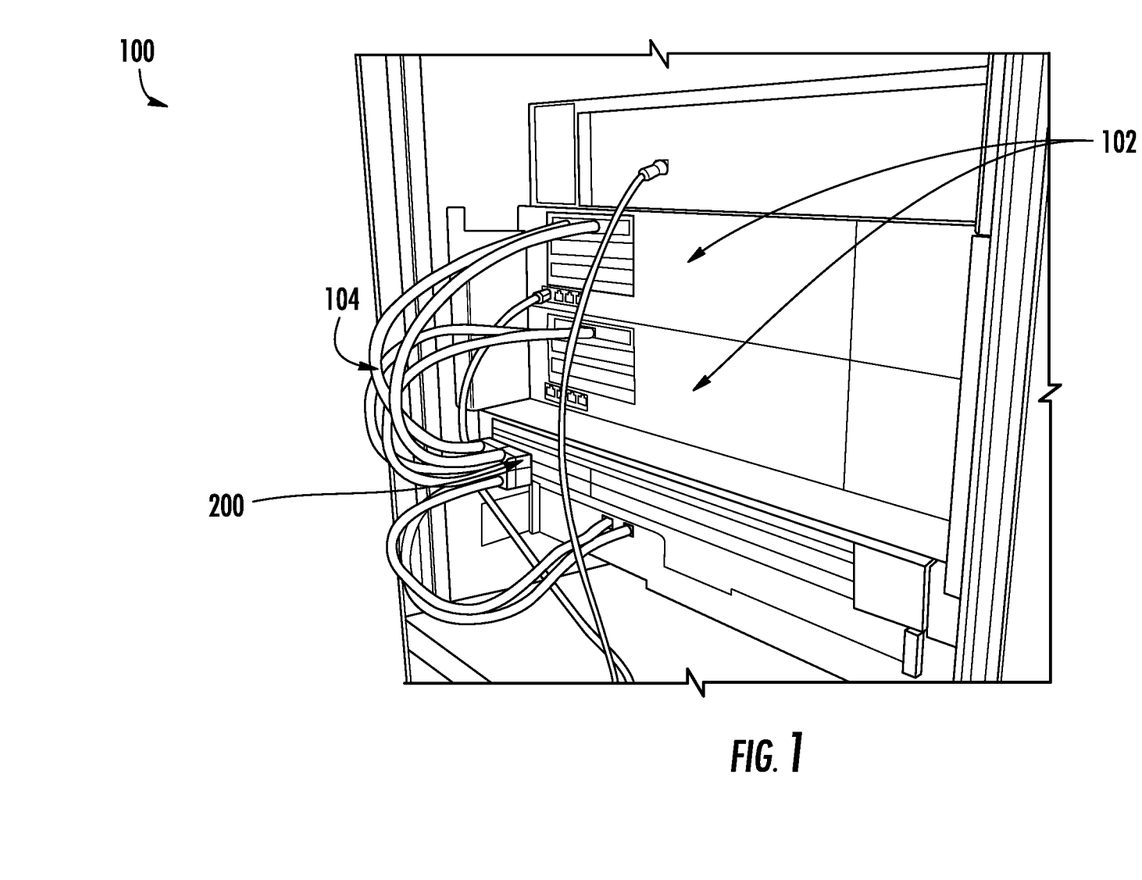
FIG. 1 is a front perspective view of a rack of switch modules in a datacenter for use in accordance with some embodiments discussed herein.

With continued reference to FIG. 1, for example, a switch module 102, which may house an application-specific integrated circuit (ASIC) as well as other internal components (not visible), is typically incorporated into a datacenter network via connections to other switch systems, servers, and network components. A switch module 102 may, for example, interact with other components of the datacenter via external optical cables 104 and possible transceiver systems housed in the end of an optical cable (e.g., VCSEL 306 in FIG. 7 of an active optical cable). These optical cables 104 and transceivers may connect a switch module and the other components of the datacenter network via adaptive connectors 200 of the switch modules 102.

The switch modules 102 may be configured to be received by a datacenter rack 100 and may be configured to allow for the conversion between optical signals and electrical signals. For example, optical cables 104 may carry optical signals as inputs to the switch module 102. The optical signals may be converted to electrical signals via an opto-electronic transceiver, which may form part of the optical cable 104 in cases in which the optical cable 104 is an Active Optical Cable (AOC), such as a cable that includes a QSFP connector that is received by a port of a switch module 102. In other cases, the optical cable 104 may be passive, and the switch module 102 may include opto-electronic components that convert between optical signals and electrical signals. The electrical signals may then be processed by the switch module 102 and/or routed to other computing devices, such as servers and devices on other racks or at other datacenters via other components and cables (not shown). In addition, electrical signals received from other networking devices (e.g., from other datacenters, racks, etc.) may be processed by the switch module 102 and then converted into corresponding optical signals to be transmitted via the optical cables 104, going the opposite direction.

With continued reference to the datacenter rack 100 of FIG. 1, the transmission of data as electrical signals and conversion between optical signals and electrical signals (e.g., via an AOC 104 and associated transceiver system or AOM) often results in the generation of heat by the components of the data center rack 100. As would be understood by one of ordinary skill in the art in light of the present disclosure, higher temperatures associated with rising heat emissions can correspond to the increased likelihood of failure of electrical components and changes in electrical and/or optical parameters. Additionally, localization or concentration of higher temperatures in electrical components (e.g., the top surface of the AOC or AOM) can result in a further increase in the likelihood of failure of electrical components located near the area of concentration.

Accordingly, embodiments of the invention described herein provide an adaptive connector, where the connector provides higher thermal efficiency by utilizing nontraditional materials, an integral body, and heat dissipation elements to more evenly distribute heat and/or to more effectively dissipate the heat to the surrounding environment to maintain lower temperatures in the components.

Figure 2:
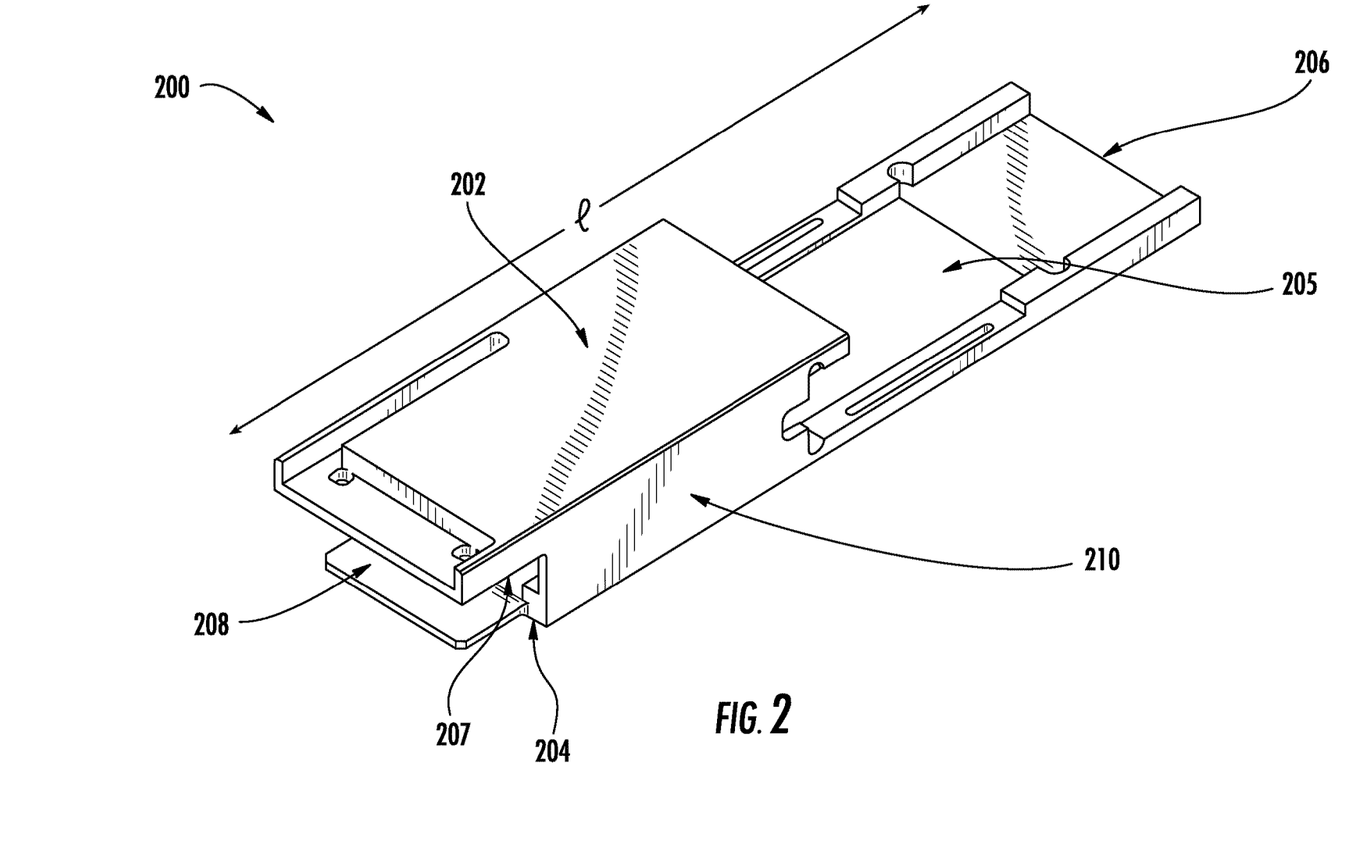
FIG. 2 is a perspective view of an adaptive connector according to an example embodiment.
Figure 3:
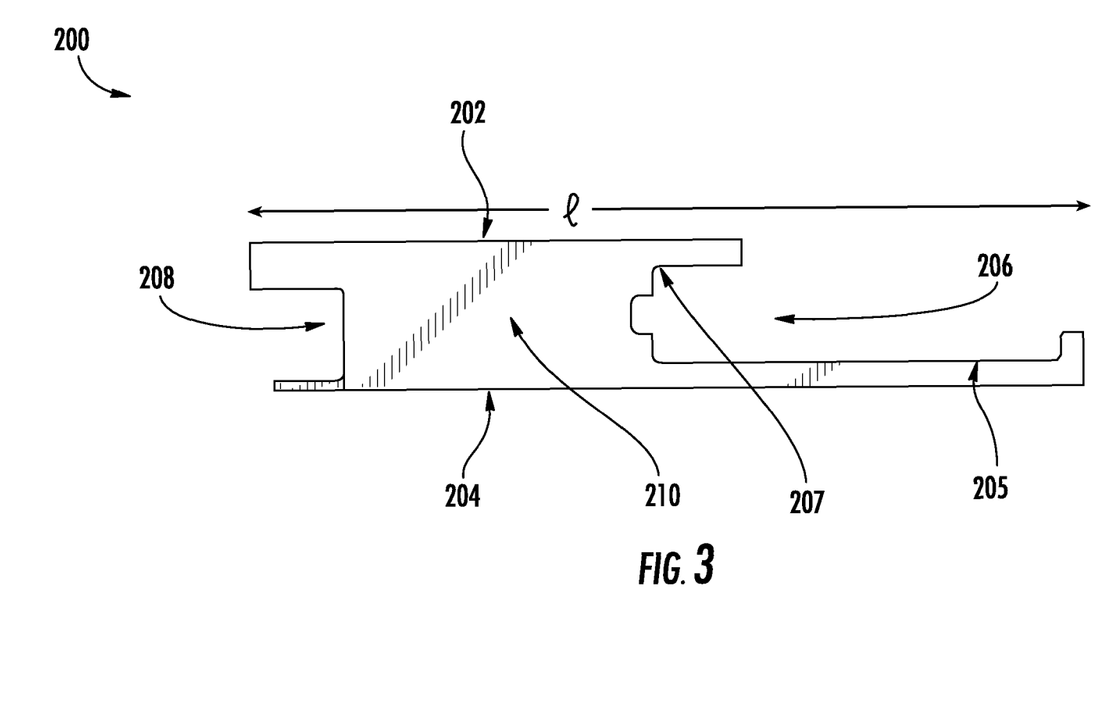
FIG. 3 is a side view of the adaptive connector of FIG. 2 according to an example embodiment.

With reference to FIGS. 2-3, an adaptive connector 200 is illustrated. The body of the adaptive connector 200 may be defined by a top portion 202, a bottom portion 204, and side portions 210 extending between the top portion 202 and bottom portion 204 (opposite side portion not shown). The body of the adaptive connector 200 may also be configured to at least partially receive a cable connector (e.g., the cable connector 300 shown in FIG. 6). By way of example, the body of the adaptive connector 200 may define a channel, through-hole, or other space configured to receive at least a portion of the cable connector, such that the body at least partially surrounds that portion.

The adaptive connector 200 may also define a first end 206, where the first end 206 is configured to receive a cable connector. As illustrated in FIGS. 2-3, the first end 206 of the adaptive connector 200 may be defined by an extension of the bottom portion 204 such that at least a portion of the cable connector may rest upon the bottom portion 204, or otherwise engage or contact an inner surface 205 of the bottom portion 204. In some alternate embodiments, the top portion 202 and side portions 210 may also extend at least a portion of the length l along the first end 206, and may also be configured to support, engage, or enclose a portion of the cable connector. The first end 206 may be configured to receive a cable connector of any dimension or of any type (e.g., AOC, Ethernet, Direct Attach Copper, etc.). By way of example, the first end 206 may be configured to receive a cable connector corresponding to an AOC such that the AOC is secured to the adaptive connector 200 by resting upon, and/or engaging at least a part of the inner surface 205 of the bottom portion 204 of the adaptive connector 200. The AOC may further extend at least partially into the inner space (e.g., receiving space 212 in FIG. 5) defined by the top portion 202, bottom portion 204, and side portions 210.

The adaptive connector 200 may further define a second end 208, where the second end 208 is configured to be received by a switch module for enabling signals to pass between the cable connector and the switch module. As can be seen in FIG. 1, the adaptive connector 200 may be configured to engage, or be secured to, a switch module 102. The adaptive connector 200 may be configured such that the second end 206 defines at least one extension capable of being received by a datacenter switch module 102 (e.g., male to female connection). By way of example, the top portion 202 of the adaptive connector 200 may be configured such that the second end 208 defines a slotted extension that may engage a port of a datacenter switch system. As discussed above, the opening defined by the body of the adaptive connector 200 may be such that an active end (e.g., active cable end 302 in FIG. 6) of a cable connector may extend through the body of the adaptive connector 200. Specifically, the active end of the cable connector may be such that upon engagement of the second end 206 of the adaptive connector 200 with the switch module, the active end of the cable connector may also engage the switch module such that signals may be transmitted between the cable and switch module. By way of a more particular example, an AOC may be received by the adaptive connector 200 such that at least a portion of the AOC is supported and/or surrounded by the body of the adaptive connector 202. The active end of the AOC (i.e., the end configured to engage a datacenter switch module and allow electrical communication therein) may be positioned such that when the adaptive connector 200 engages a datacenter switch module, the active end of the AOC engages the corresponding port of the switch system to allow signals (e.g., electrical signals, optical signals, or the like) to travel between the AOC and the switch module.

In some embodiments, as will be described in more detail below with reference to a method of manufacture, the body of the adaptive connector 200 defined by the top portion 202, bottom portion 204, and side portions 210 extending between the top portion 202 and bottom portion 204 may form an integral body. In other words, the body of the adaptive connector 200 may be created from a single piece of material (e.g., extruded) as opposed to being assembled by joining two separate portions of material. By utilizing an integral body, the adaptive connector 200 may facilitate uniform heat distribution and increase thermal performance. When multiple sections are assembled to form a connector, heat transfer between the two sections (e.g., the top portion 202 and the bottom portion 204) is lower than a single integral body. This is because by assembling multiple sections to form a body, gaps and spaces are found between the sections at the connections between the sections. This resultant air found between the sections reduces the heat transfer rate and the corresponding thermal performance as between these two sections. By utilizing a single piece of material and an integral body, however, the adaptive connector 200 may increase its thermal performance by reducing insulative regions.

Figure 4:
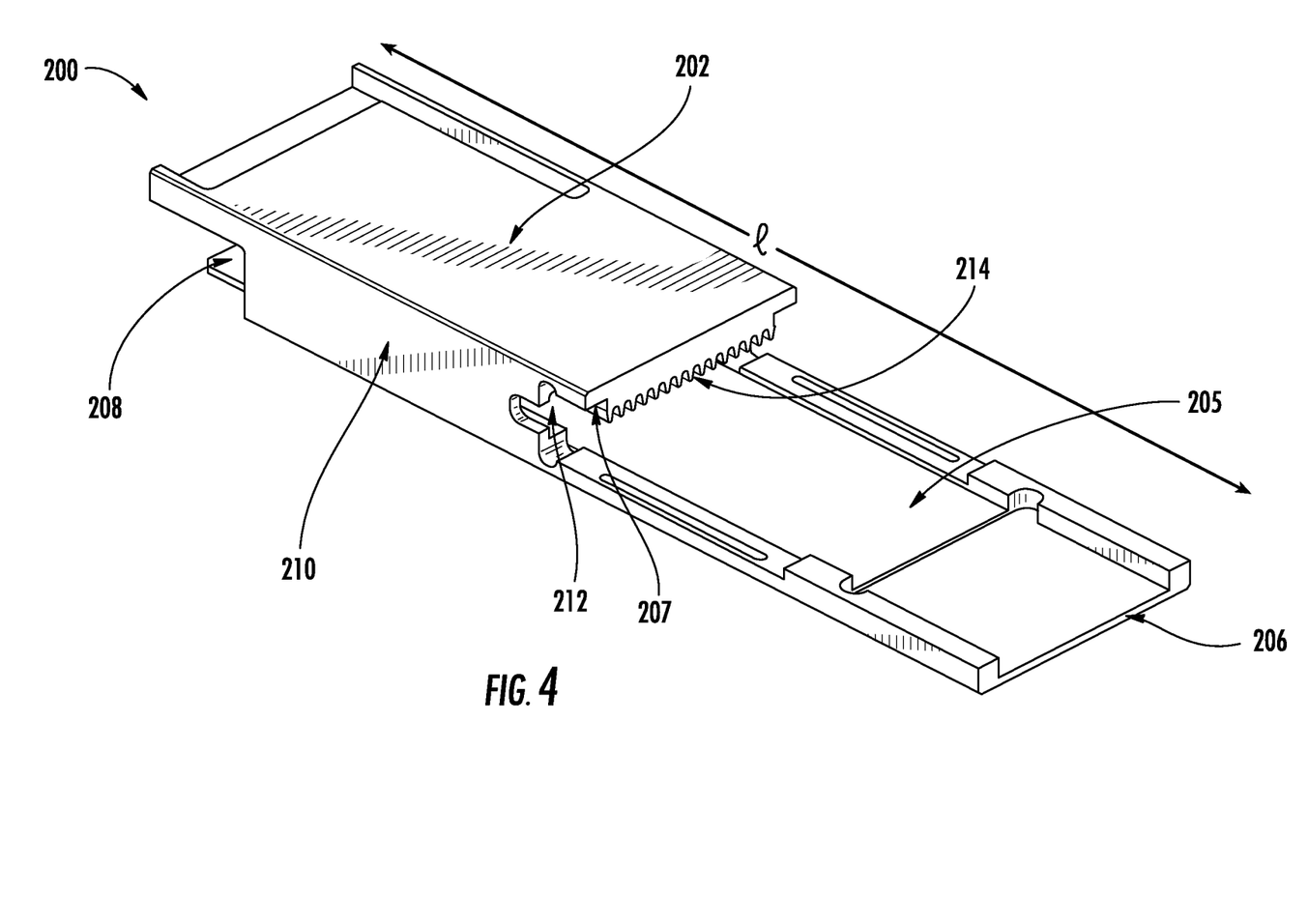
FIG. 4 is a perspective view of the adaptive connector of FIG. 2 according to an example embodiment.
Figure 5:
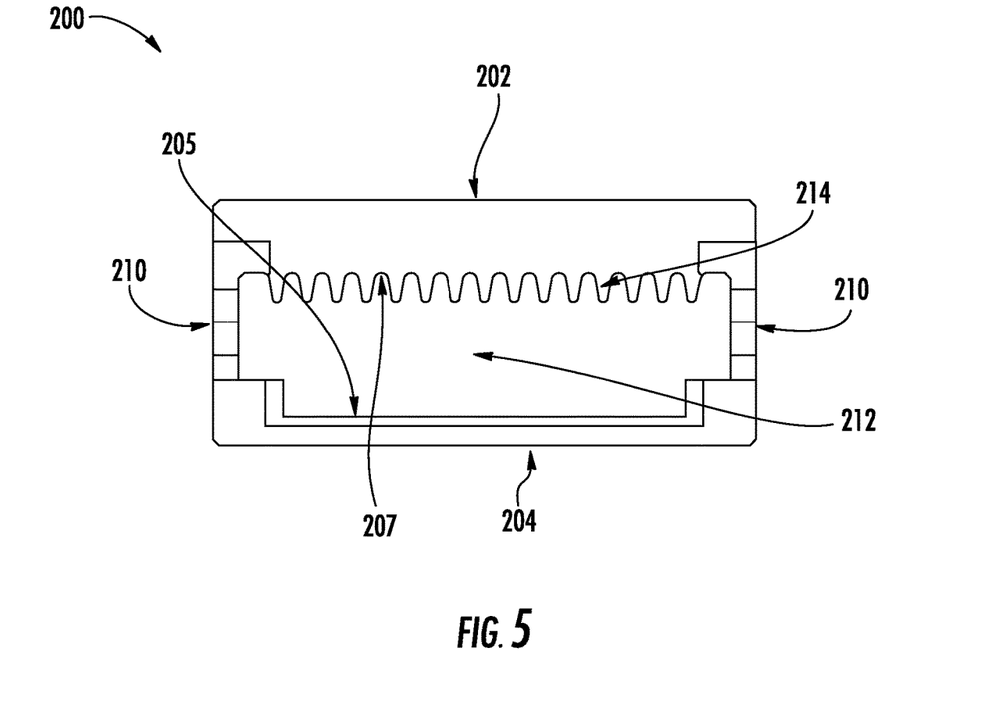
FIG. 5 is an end view of the adaptive connector of FIG. 2 according to an example embodiment.

With reference to FIGS. 4-5, the adaptive connector 200 may further facilitate the dissipation of heat by defining a heat dissipation element 214. The heat dissipation element 214 may be disposed on an inner surface 207 of the top portion 202 and may extend towards the receiving space 212 defined by the top portion 202, the bottom portion 204 and the side portions 210. The heat dissipation element 214 may be configured to facilitate the transfer of heat from the adaptive connector 200 to an external environment of the adaptive connector 200. As can be seen in FIG. 5, the heat dissipation element 214 may extend into the receiving space 212 and may extend along a length l of the body (e.g., between the first and second ends 206,208). In some embodiments, the heat dissipation element 214 may further be integral to the top portion 202 of the body. For example, in some embodiments, the top portion 202, bottom portion 204, and side portions 210 may be integrally formed as one piece. In such an embodiment, as described above, the lack of connections between separate body portions (e.g., the use of a single piece of material to form the body and heat dissipation element 214) facilitates the transfer of heat from the body to the heat dissipation element 214.

In some embodiments, the heat dissipation element 214 may comprise a plurality of fins. In such an embodiment, the plurality of fins may also extend from the top portion 202 into the receiving space 212. Although depicted in FIGS. 4-5 as a plurality of fins extending along the length l of the adaptive connector 200 between the first end 206 and the second end 208, the present disclosure contemplates that the heat dissipation element 214 may be oriented in any direction, may be disposed on any inner surface or portion of an inner surface of the body of the adaptive connector 200, and may extend into the receiving space 212 at any angle (e.g., perpendicularly with respect to the inner surface from which it extends or at other angles).

The heat dissipation element 214 (e.g., the plurality of fins) may facilitate the transfer of heat from the adaptive connector 200 to an external environment of the adaptive connector 200 by increasing the convective cooling experienced by the adaptive connector 200. For example, the heat dissipation element 214 may increase the rate of heat transfer to an external environmental by increasing the surface area of the portion of the adaptive connector contacting the external environment. In other words, by utilizing a heat dissipation element 214 (e.g., a plurality of fins), the adaptive connector 200 can increase its surface area such that more area is in contact with the air of its external environment (e.g., the air from the environment that is contained and/or flowing through the receiving space 212). As such, air traveling along the fins is able to receive more heat transferred from the body than it would have otherwise if contacting a flat surface. As a result, the temperature of the heat dissipation element (e.g., the ends of the plurality of fins) remains lower than the temperature of the rest of the body of the adaptive connector (e.g., the top portion 202 and/or bottom portion 204) and results in a larger temperature gradient between these surfaces, thereby serving as a heat sink. The resultant temperature gradient also facilitates transfer of heat from the adaptive connector 200 to the external environment.

Figure 6:
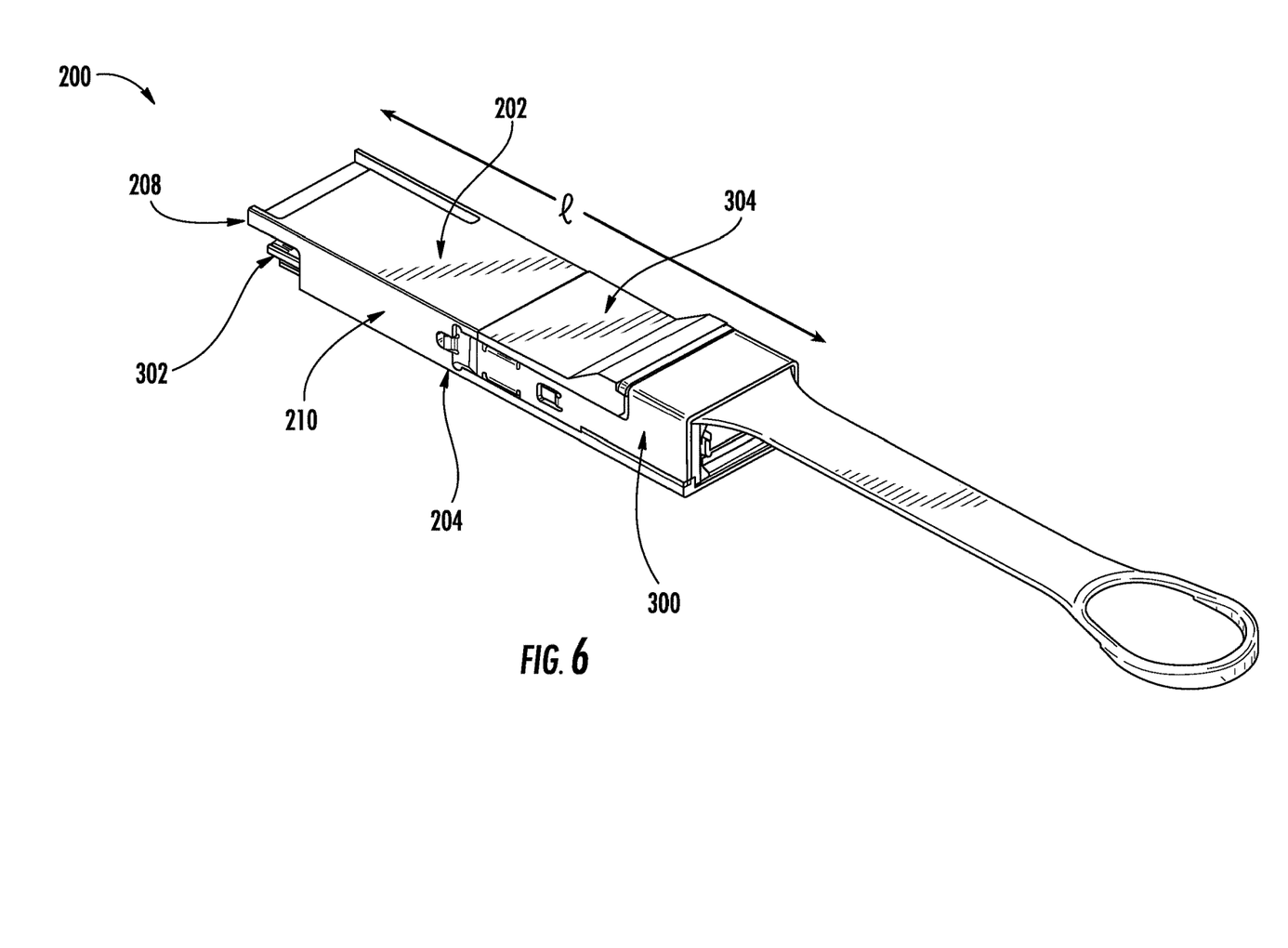
FIG. 6 is a perspective view of the adaptive connector of FIG. 2 coupled with an active optical module according to an example embodiment.

With reference to FIG. 6, an adaptive connector 200 is depicted that is engaged with a cable connector 300 (e.g., an AOC connector, Ethernet connector, Direct Attach Copper connector, Active Optical Module, or the like). As discussed above, the cable connector 300 may be secured to or rest partially upon the bottom portion 204 and may extend partially into the receiving space 212 (shown in FIG. 5). The active end 302 of the cable connector 300 may be positioned proximate the second end 206 of the adaptive connector 200. In some embodiments, the active end 302 of the cable connector 300 may be configured to be received by a switch module of a datacenter rack and to allow communication between the switch module and an AOC or AOM. The cable connector 300 may further include a cable cover 304 for shielding components housed within the cable connector 300. In some embodiments, the cable connector may be disposed at the end of the AOC and may house an optoelectronic transceiver capable of converting between electrical and optical signals (e.g., an AOM).

Figure 7:
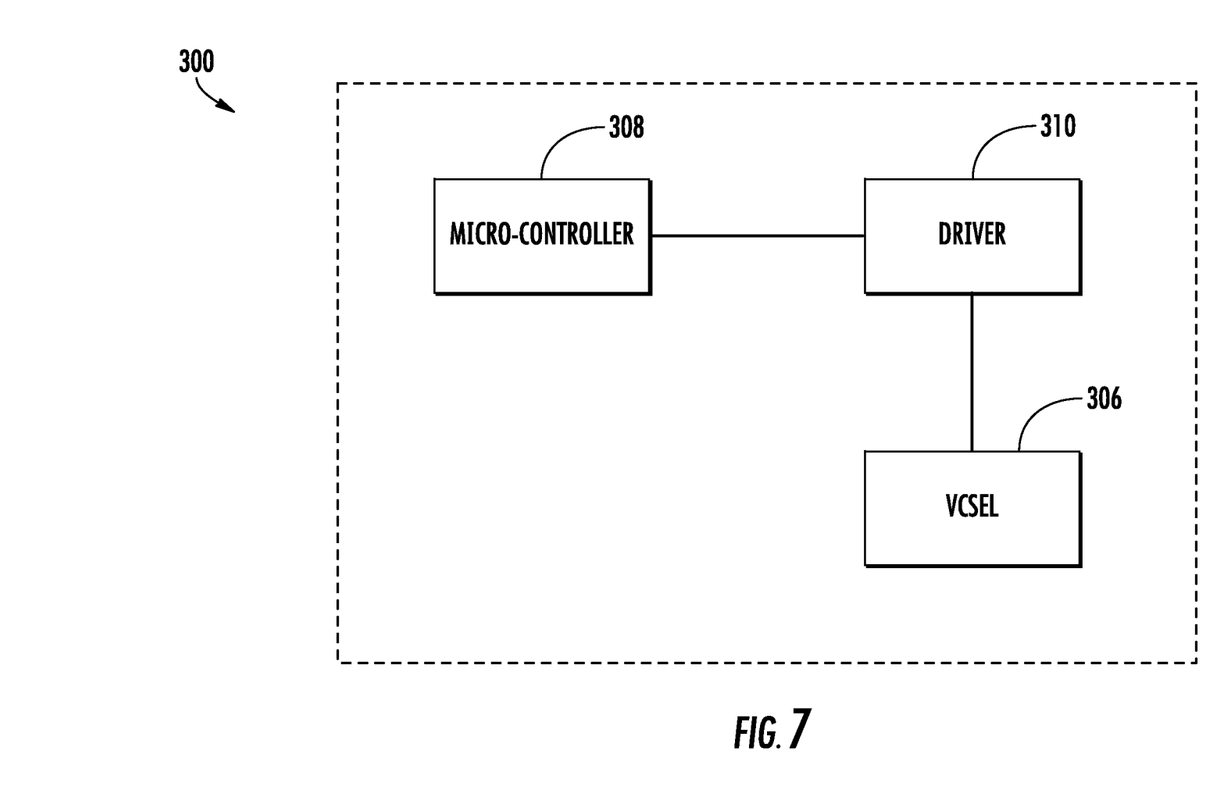
FIG. 7 is a schematic view of components of an active optical module according to an example embodiment.

With reference to FIG. 7, the internal components of the cable connector 300 (e.g., an AOM or transceiver system) are schematically illustrated. The cable connector 300 may further include one or more VCSELs 306, drivers 310, and/or microcontrollers 308. The VCSELs 306, drivers 310, and microcontrollers 308 may convert between optical signals and electrical signals. In some embodiments, as discussed above, the switch module (rather than the cable connector 300) may house a transceiver system and associated drivers/microcontrollers, such that conversion between electrical and optical signals occurs in the switch module.

Figure 8:
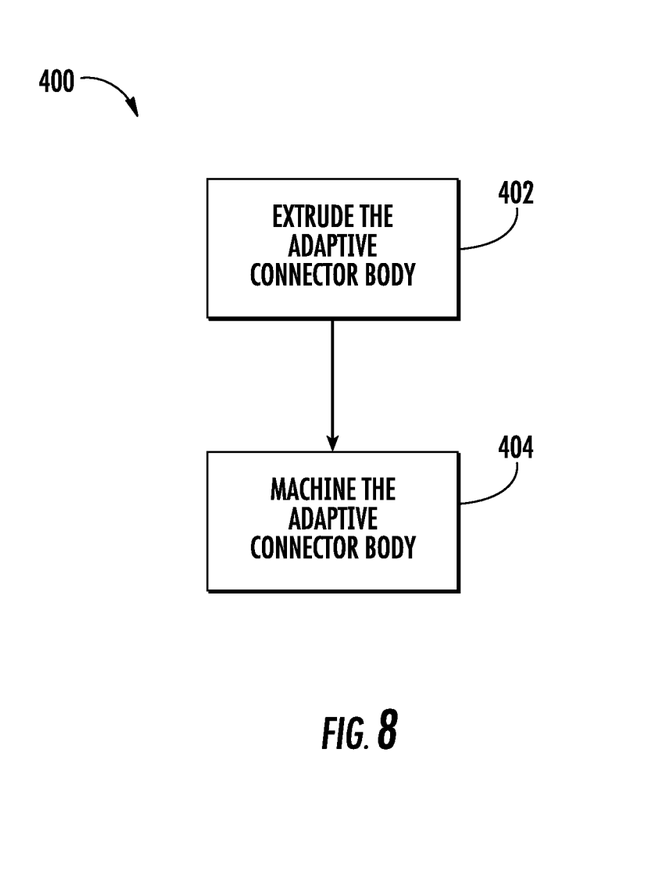
FIG. 8 illustrates a flowchart depicting a method of manufacturing an adaptive connector according to an example embodiment.
Figure 9:
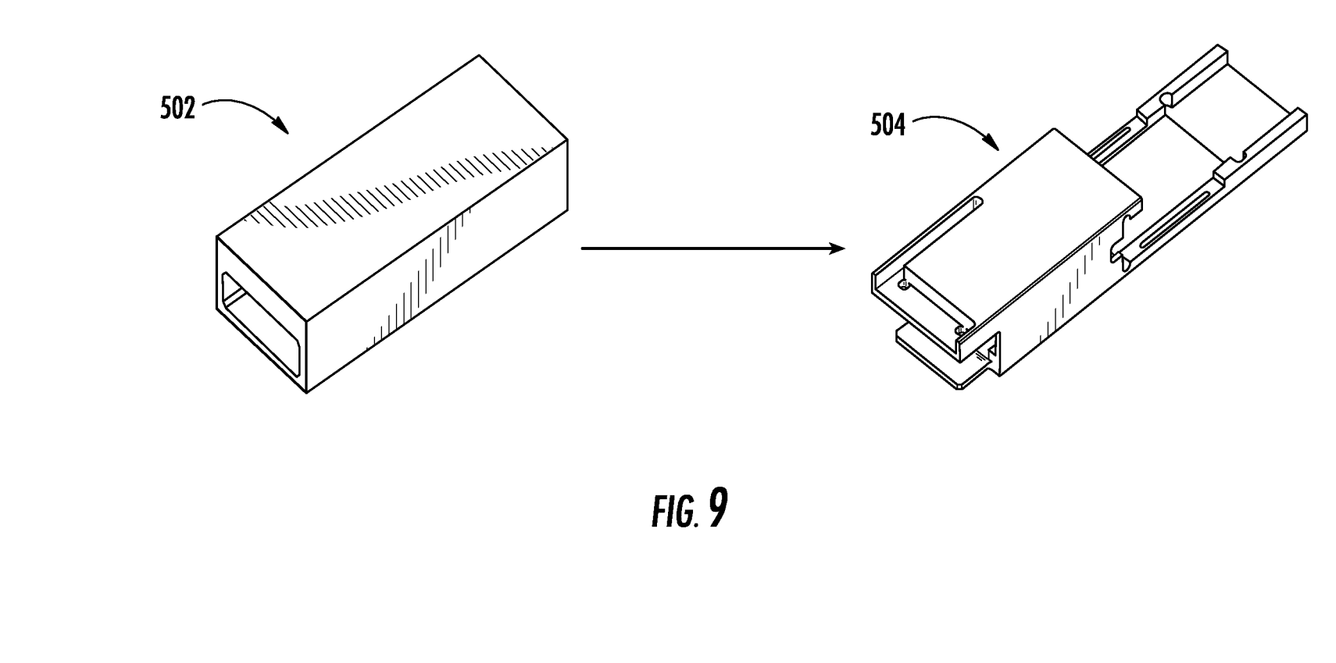
FIG. 9 illustrates stages in the method of manufacturing of FIG. 8 according to an example embodiment.

With reference to FIGS. 8-9, a method of manufacturing an adaptive connector is illustrated. The method of manufacture (e.g., method 400) may include the steps of extruding the adaptive connector body at Block 402, and machining the adaptive connector body at Block 404. In particular, the step of extruding the adaptive connector body at Block 402 may produce a single body of fixed cross-sectional area. The material may be pushed through a dimensioned die such that the body of the adaptive connector is created (e.g., extrusion 502 in FIG. 9). As can be seen with reference to the machined body 504 in FIG. 5, the extrusion 502 may be modified through a machining process at Block 404 whereby material is removed from the extrusion 502 to create the final adaptive connector 504 (e.g., adaptive connector 200 in FIGS. 3-7). The machining process may include any or all of micro machining, turning, milling, drilling, grinding, water jet cutting, EDM, EDM, AFM, USM, CNC, and the like, in any order or combination.

The adaptive connector 200 may also be created from a variety of materials compatible for use in datacenter switch modules and systems. In some embodiments, the adaptive connector 200 may be comprised of a copper or aluminum alloy in order to promote and facilitate heat transfer with an external environment of the adaptive connector, as such materials have higher thermal conductivity properties as compared to ZAMAK or equivalent zinc based alloys used in conventional connectors.

As shown in FIGS. 3-7, the adaptive connector 200 may include any number of engagement or attachment means including, channels, slots, holes, and the like disposed on any surface of the adaptive connector 200 in order for the adaptive connector 200 to receive, align, and/or secure a cable connector (e.g., the cable connector 300). The adaptive connector may further be dimensioned and/or scaled to accommodate cables and connectors of any size, particularly for use in datacenter switch modules.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components (e.g., components of printed circuit boards, transceivers, cables, etc.) may be used in conjunction with the adaptive connector. Therefore, it is to be understood that the inventions are not to be limited to the specific embodiments disclosed and that modifications and other embodiments are intended to be included within the scope of the appended claims. Moreover, the steps in the method described above may not necessarily occur in the order depicted in FIG. 8, and in some cases one or more of the steps depicted may occur substantially simultaneously, or additional steps may be involved. Although specific terms are employed herein, they are used in a generic and descriptive sense only and not for purposes of limitation.

What is claimed is:

1. An adaptive connector configured to connect between a cable connector and a switch module in a datacenter, the adaptive connector comprising:
    a body formed from a single piece of material and defined by a top portion, a bottom portion, and two side portions extending therebetween, wherein the body defines a receiving space configured to at least partially receive a cable connector therein,
    wherein the body defines:
        a first end configured to receive the cable connector;
        a second end configured to be received by a switch module for enabling signals to pass between the cable connector and the switch module;
        the body further comprising a heat dissipation element extending from an inner surface of the top portion towards the receiving space,
            wherein the heat dissipation element is configured to allow heat to be transferred from the body to an external environment of the adaptive connector.

2. The adaptive connector according to claim 1, wherein the heat dissipation element is integral to the top portion of the body.

3. The adaptive connector according to claim 1, wherein the heat dissipation element is disposed longitudinally along the length of the connector between the first end and the second end.

4. The adaptive connector according to claim 1, wherein the heat dissipation element further comprises a plurality of fins.

5. The adaptive connector according to claim 1, wherein the connector is comprised of a copper alloy.

6. The adaptive connector according to claim 1, wherein the connector is comprised of an aluminum alloy.

7. The adaptive connector according to claim 1, wherein the cable further comprises an active optical cable and active optical module for transmitting optical signals.

8. The adaptive connector according to claim 1, wherein the cable further comprises a direct attach copper cable.

9. The adaptive connector according to claim 1, wherein the cable further comprises an Ethernet cable.

10. A method of manufacturing an adaptive connector configured to connect between a cable connector and a switch module in a datacenter, the method comprising:
    extruding a body to define a top portion, a bottom portion, and two side portions extending therebetween, wherein the body is formed from a single piece of material and wherein the body defines a receiving space configured to at least partially receive a cable connector therein; and
    machining the body to define a first end configured to receive the cable connector and a second end configured to be received by a switch module for enabling signals to pass between the cable connector and the switch module;
    wherein machining the body to define the body further comprises defining a heat dissipation element extending from an inner surface of the top portion towards the receiving space, wherein the heat dissipation element is configured to allow heat to be transferred from the body to an external environment of the adaptive connector.

11. The method according to claim 10, wherein the heat dissipation element is formed integral to the top portion of the body.

12. The method according to claim 10, wherein the heat dissipation element is disposed longitudinally along the length of the connector between the first end and the second end.

13. The method according to claim 10, wherein the heat dissipation element further comprises a plurality of fins.

14. The method according to claim 10, wherein the adaptive connector is comprised of a copper alloy.

15. The method according to claim 10, wherein the adaptive connector is comprised of an aluminum alloy.

16. The method according to claim 10, wherein the cable further comprises an active optical cable and active optical module for transmitting optical signals.

17. The method according to claim 10, wherein the cable further comprises a direct attach copper cable.

18. The method according to claim 10, wherein the cable further comprises an Ethernet cable.

* * * * *